United States Patent
Kao

(10) Patent No.: US 6,323,514 B1
(45) Date of Patent: Nov. 27, 2001

(54) CONTAINER STRUCTURE FOR FLOATING GATE MEMORY DEVICE AND METHOD FOR FORMING SAME

(75) Inventor: David Y. Kao, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/348,725

(22) Filed: Jul. 6, 1999

(51) Int. Cl.$^7$ .................................................. H01L 29/788
(52) U.S. Cl. .......................... 257/315; 257/316; 257/317; 257/318; 257/323; 438/211; 438/257
(58) Field of Search ................... 257/314–323, 257/239; 438/201, 211, 257

(56) References Cited

U.S. PATENT DOCUMENTS

| | | | |
|---|---|---|---|
| 5,089,867 | 2/1992 | Lee | 357/23.5 |
| 5,281,548 * | 1/1994 | Prall | 437/43 |
| 5,354,705 | 10/1994 | Mathews et al. | 437/52 |
| 6,117,731 * | 9/2000 | Wu | 438/260 |

* cited by examiner

Primary Examiner—Tom Thomas
Assistant Examiner—Donghee Kang

(57) ABSTRACT

A floating gate memory device comprises a first conductive floating gate layer which is horizontally oriented and a second conductive floating gate layer which is predominantly vertically oriented. The second layer contacts the first layer to make electrical contact therewith and also defines a recess. A control gate is formed within the recess. Having the control gate formed in the floating gate layer recess increases the capacitive coupling between the floating and control gates thereby improving the electrical properties of the cell and allowing for a reduction in cell size while maintaining 5 Claims, 4 Drawing Sheets

CONTAINER STRUCTURE FOR FLOATING GATE MEMORY DEVICE AND METHOD FOR FORMING SAME

FIELD OF THE INVENTION

This invention relates to the field of semiconductor manufacture, and more particularly to a floating gate memory device having a container structure for storing an electric charge.

BACKGROUND OF THE INVENTION

As with most electronic devices, an engineering design goal for programmable read-only memories (PROMs) is to decrease the size and power consumption of the devices. Power consumption includes the power used to program PROMs as well as operating power. Decreasing the cell size of a PROM device also decreases the time required to output the desired information from a selected floating gate.

Shrinking a PROM such as an erasable device (EPROM) includes narrowing the width of the floating gate and the control gate with a similar reduction in the width of the channel. Narrowing the width of the two gates, however, decreases the coupling capacitance between the two gates which increases the likelihood of errors while reading the cell charge.

The floating gate of an EPROM forms a capacitor with the control gate and also with the source, the drain, and the channel of the cell. If the surface areas of the floating and/or control gates are increased, the gate width can be reduced while maintaining the same coupling capacitance between the gates. The coupling capacitances associated with the floating gate are described by the coupling coefficient, which is depicted by the equation $$CC=C1/(C1+C2+C3+C4)$$

where CC is the coupling coefficient and C1, C2, C3, and C4 represent the capacitance between the floating gate and the control gate, the source, the drain, and the channel respectively. As an example, if C1=0.5, C2=0.1, C3=0.1, and C4=0.3, the coupling coefficient would equal 0.5 (50%). If the area of the surface of the floating gate near the control gate is increased by 100%, C1 would increase to 1.0, and CC would increase to 0.67 (67%). With this increase, the size of the gates could be decreased by 50%, which would reduce the coupling coefficient by 17% back to the original 50%. As can be determined from the equation, the coupling coefficient can never reach the ideal state (1.00) since the capacitance between the floating gate and the control gate is always divided by itself plus some additional capacitance. Still, the goal of designers is to bring the coupling coefficient as close to unity as possible.

A structure used with dynamic random access memories (DRAMs) to increase the available storage area is a container cell. For example, U.S. Pat. No. 5,354,705 by Mathews et al., assigned to Micron Technology, Inc. and incorporated herein by reference in its entirety, describes a DRAM container cell and method of manufacture. The container cell, which is in direct electrical contact with the semiconductor wafer, often through a silicide layer, increases the surface area on which electrons can be stored. Mathews also describes the use of textured polysilicon, which further increases the surface area of the storage node cell plate and augments the charge that can be stored on the node. Using a textured capacitor storage node allows a decrease in the size of the DRAM, and therefore an increase in the density of the DRAM, while maintaining an equal capacitance. The use of textured polysilicon has been described with applications to floating gate devices, for example in U.S. Pat. 5,089,867 by Roger Lee, assigned to Micron Technology, Inc. and incorporated herein by reference in its entirety. Lee describes a floating gate having a textured upper surface which increases the coupling between the floating and control gates.

A method and structure for use with a floating gate device which increases the coupling coefficient between the floating and control gates would be desirable.

SUMMARY OF THE INVENTION

The present invention provides a new structure and method for forming the structure which increases coupling between the floating gate and the control gate. In accordance with one embodiment of the invention, a floating gate memory device comprises a first polysilicon floating gate layer oriented in a first direction and a second polysilicon floating gate layer oriented predominantly in a second direction generally perpendicular with the first direction. The second layer electrically contacts the first layer and has a portion which defines a recess therein. The second layer has a larger and predominantly vertically oriented surface area in comparison to a conventional cell, and thus the cell requires no additional horizontal space. The recess receives a control gate layer which has a surface conformal and substantially coextensive with the second floating gate layer, and thus the coupling coefficient between the floating gate and the control gate is increased.

Increasing the coupling between the floating and control gates increases the coupling coefficient of the transistor if the line width (and cell size) is maintained, or allows for a decrease in the line with (and cell size) while maintaining the coupling coefficient of the transistor.

Objects and advantages will become apparent to those skilled in the art from the following detailed description read in conjunction with the appended claims and the drawings attached hereto.

Figure 1:
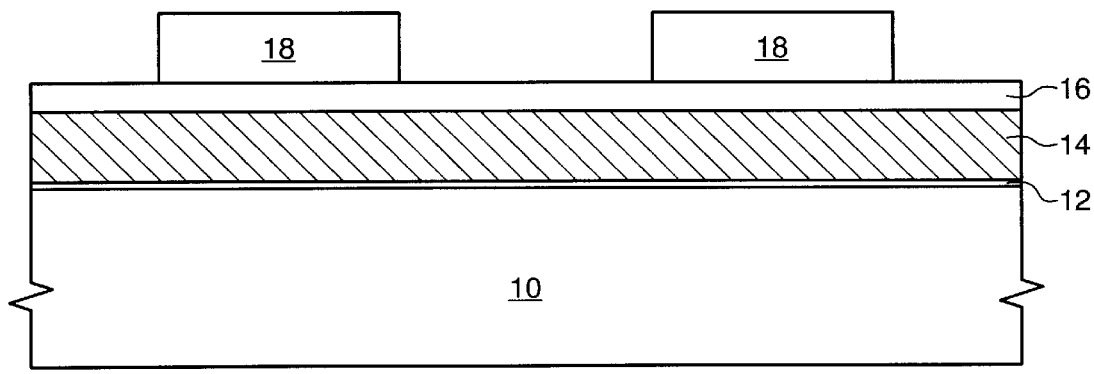
FIG. 1 is a cross section depicting a starting structure comprising a semiconductor wafer, a tunnel oxide, a first floating gate layer, a first oxide layer, and a patterned photoresist layer thereover.
Figure 2:
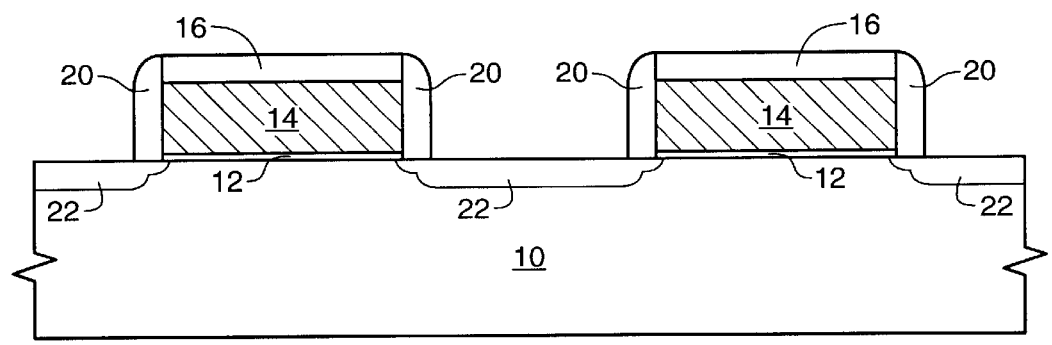
FIG. 2 depicts the FIG. 1 structure after an etch step, a first implant, a step to form spacers, and a second implant.

It should be emphasized that the drawings herein may not be to exact scale and are schematic representations. The drawings are not intended to portray the specific parameters, materials, particular uses, or the structural details of the invention, which can be determined by one of skill in the art by examination of the information herein.

DETAILED DESCRIPTION OF THE PREFERRED EMBODIMENT

A first embodiment of a method for forming an inventive floating gate memory device is depicted in FIGS. 1–6. FIG.

1 depicts a semiconductor wafer substrate assembly comprising a semiconductor wafer 10 having a first oxide layer 12, for example a tunnel oxide layer, formed thereover. A tunnel oxide layer between about 50 angstroms (Å) and about 100 Å would be sufficient. A first conductive floating gate layer 14, for example polycrystalline silicon (polysilicon, poly), is formed to contact the tunnel oxide. A first floating gate layer between about 300 Å and about 1000 Å thick would be sufficient.

Subsequently, a second oxide layer 16, or alternately a nitride layer, between about 2,000 Å and about 2,500 Å thick as a capping layer is formed over the first floating gate layer. A patterned photoresist layer 18 as known in the art is formed over the second oxide layer.

The second oxide layer 16, the polysilicon layer 14, and the tunnel oxide layer 12 are etched according to the pattern of photoresist layer 18. To etch the oxide layers 12 and 16, an atmosphere of $CF_4$ at a flow rate of 50 standard cubic centimeters (sccm) and $CHF_3$ at a flow rate of 50 sccm at a temperature of about 50° C. and a pressure of about 10 milliTorr (mT) would remove the oxide at a rate of about 40 Å/second. Thus for the 2,000 Å to 2,500 Å second oxide layer, a duration of between about 50 seconds and about 62 seconds would be sufficient, and for the 50 Å to 100 Å first oxide layer, a duration of between about one second and about two seconds would be sufficient. To etch the polysilicon layer 14, an atmosphere of $Cl_2$ and HBr, each at a flow rate of 50 sccm at about 50° C. and a pressure of 10 mT would remove the polysilicon at a rate of about 40 Å/second. Thus for the 300 Å to 1,000 Å floating gate polysilicon layer, a duration of between about 7.5 seconds and about 25 seconds would be sufficient. After exposing the wafer an implant can be performed to lightly dope the wafer.

Next, a blanket oxide spacer layer is formed and vertically etched to provide spacers 20 having a height of between about 500 Å and about 1,000 Å, and a width of between about 300 Å and about 700 Å. The wafer is doped again to provide any necessary implant 22, thereby completing the FIG. 2 structure.

Figure 3:
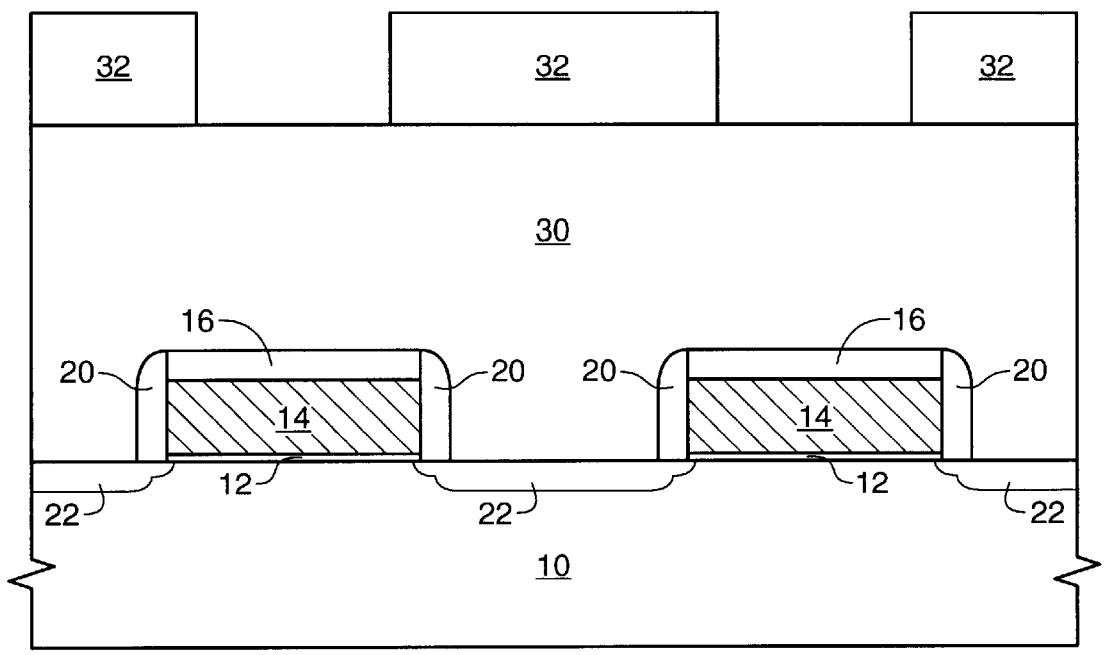
FIG. 3 is a cross section depicting the FIG. 2 structure after forming a dielectric layer and a patterned photoresist layer.
Figure 4:
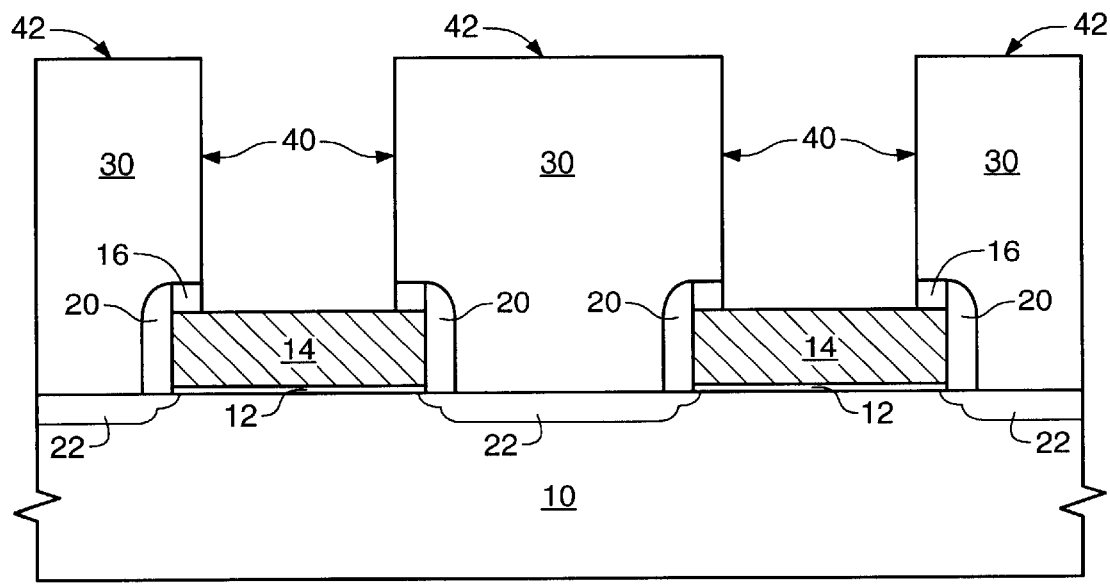
FIG. 4 depicts the structure of FIG. 3 after an etch which exposes the first floating gate layer.

Next, a planar dielectric layer 30, for example borophosphosilicate glass (BPSG) which has been chemically-mechanically planarized (CMP) to between about 3,000 Å thick and about 5,000 Å thick (preferably about 4,000 Å), and a patterned photoresist layer 32 as depicted in FIG. 3 are formed. The BPSG 30 and the oxide layer 16, as well as any other intervening layers depending on the application of the invention, are etched, thereby forming first and second cross-sectional sidewalls 40 in the dielectric and exposing the first floating gate layer. It should be noted that the first and second sidewalls are cross-sectional as the dielectric structure can comprise a circular or oval opening and the opening would therefore have only one continuous sidewall 40 when viewed from above. An etch comprising an atmosphere of $CHF_3$ at a flow rate of 50 sccm, a temperature of about 50° C., and a pressure of about 15 mT would remove about 40 Å of oxide/minute. Thus for a second oxide layer 16 between about 2,000 Å and about 2,500 Å and a BPSG layer 30 between about 3,000 Å and about 5,000 Å, a duration of between about two minutes and about three minutes would be sufficient. The photoresist is removed, thereby resulting in the structure depicted in FIG. 4. An upper surface 42 of the dielectric 30 intersects the sidewall 40 and a portion of the dielectric 30 overlies a portion of the first floating gate layer as depicted. FIG. 4 further depicts that the dielectric sidewalls 40 define a recess therebetween which exposes a portion of the first floating gate layer.

Figure 5:
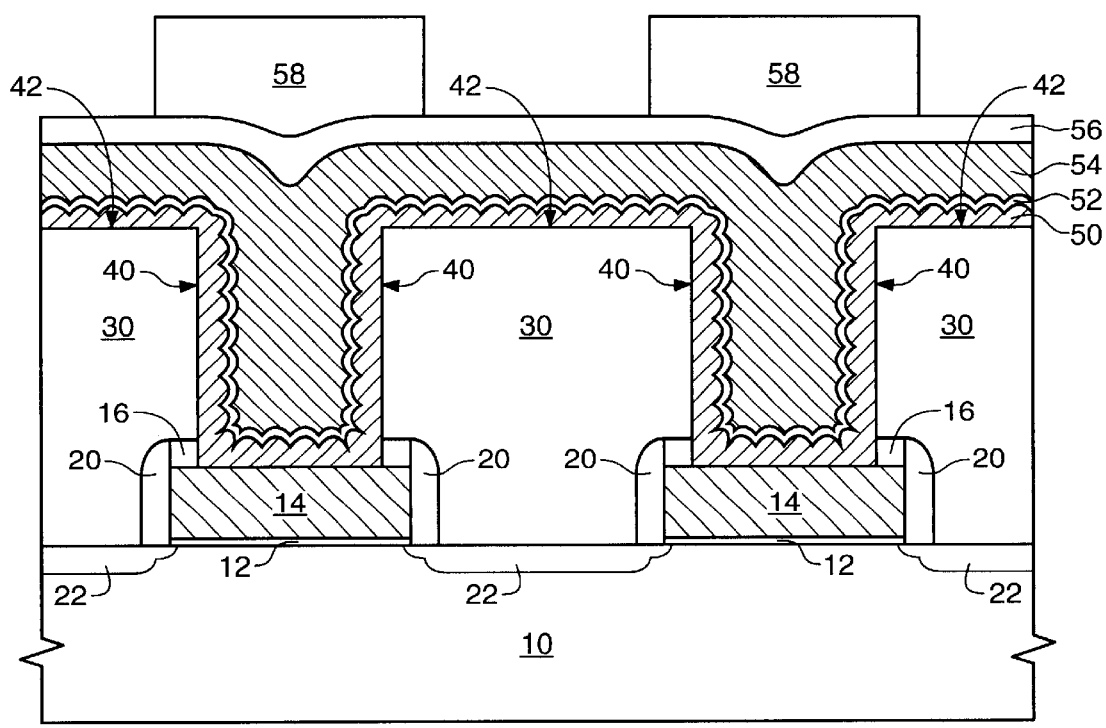
FIG. 5 depicts the FIG. 4 structure after forming a second floating gate layer, an interlayer dielectric, a control gate layer, a silicide layer, and a patterned photoresist layer.

Referring to FIG. 5, a conformal blanket second floating gate layer 50, for example polysilicon, is formed over surface of the etched dielectric, on the first floating gate layer 14, and contacts the sidewall 40 and the upper portion of the dielectric 42. The second floating gate layer comprises vertically-oriented cross sectional sidewalls as depicted in FIG. 5 and contacts the first floating gate layer such that it is electrically coupled therewith. Because the second floating gate layer is conformal with the dielectric sidewalls, a recess is formed by the second floating gate layer as depicted which comprises the cross sectional sidewalls and a bottom as depicted. The first floating gate layer is interposed between the tunnel oxide 12 and the second floating gate layer 50. A conformal polysilicon layer between about 300 Å and about 500 Å thick would be sufficient. Such a layer can be formed using a low pressure chemical vapor deposition (LPCVD) furnace at approximately 620° C. using silane gas ($SiH_4$) as a silicon source. As the poly forms at a rate of about 4,000 Å/hr, the process is performed for between about 4.5 minutes and 7.5 minutes to form the poly layer as described above. Similarly, a texturized polysilicon layer as depicted can be substituted for the smooth polysilicon layer described above. A texturized polysilicon layer having a nominal thickness of between about 300 Å and about 1,500 Å can be formed by forming using the following process, or any suitable process. First, an in situ poly layer is formed in an LPCVD furnace at about 535° C. using silane and phosphine ($PH_3$) as source gasses. The wafer is moved to an oxidation furnace to receive a phosphorous deposition to a conductivity of between about 1E18 atoms/$cm^3$ to about 5E21 atoms/$cm^3$. A native oxide will form on the poly surface. The wafer is subjected to a 60 second 100:1 hydrofluoric acid bath, which results in partial removal of the native oxide such that thin patches of oxide remain. Next, a hemispherical grain (HSG, texturized) poly is formed over the in situ poly layer using an LPCVD furnace at 555° C. using silane gas. The small oxide patches on the in situ surface give the poly layer a rough surface.

Subsequently, a conformal interlayer dielectric layer 52 is formed over the second floating gate layer. The dielectric can comprise an oxide-nitride-oxide (ONO) sandwich formed in accordance with conventional means, or another suitable layer. Next, at least a portion of a blanket polysilicon control gate layer 54 is formed within the recess provided by the second floating gate layer. To fill the recess, the control gate layer 54, in this embodiment a third gate layer, must be formed at least half as thick as the width of the recess, in the instant case between about 500 Å and about 2,000 Å. The control gate layer can be formed using a process similar to that used to form the first floating gate layer, in a low pressure chemical vapor deposition (LPCVD) furnace at approximately 620° C. using silane gas as a silicon source for between about 7.5 minutes and 30 minutes. As depicted, a lower surface of the control gate layer within the recess is conformal with an upper surface of the second floating gate layer.

An optional tungsten silicide layer 56 having a thickness of between about 500 Å and about 1,500 Å can be formed to enhance the conductivity of the control gate layer. The silicide layer can be formed by sputtering a titanium target using an argon plasma. The wafer is then annealed using a rapid thermal anneal (RTP) in a nitrogen purged chamber which rapidly ramps to between about 800° C. and about 820° C. The rapid ramp reduces the dispersion of the previously implanted dopants deeper into the substrate. A patterned photoresist layer 58 is formed over the silicide layer and/or the control gate layer.

Figure 6:
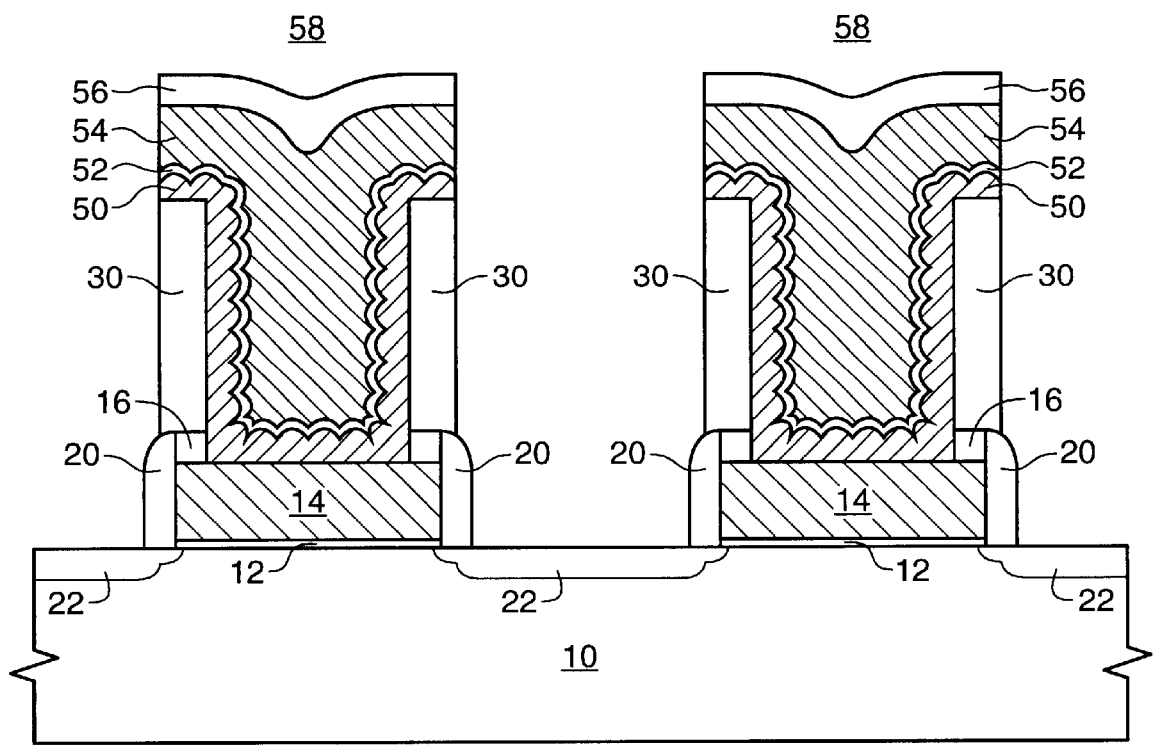
FIG. 6 depicts the FIG. 5 structure after an etch step.

An etch of the FIG. 5 structure results in the structure of FIG. 6 to form a completed floating gate and a control gate.

An etch using an atmosphere of $Cl_2$ and $CF_4$ each having a flow rate of 50 sccm at 50° C. and a pressure of 10 mT would sufficiently etch the silicide 56 at a rate of about 40 Å/minute, and thus an etch for between about 12 seconds and about 40 seconds would be sufficient. The poly etch described above for etching polysilicon layer 16 would function adequately for etching polysilicon control gate layer 54 and will stop on the oxide layer 52.

As depicted in FIG. 6 the capacitive area between the floating gate 14, 50 and the control gate 54 is greatly increased over a conventional floating gate cell, and thus the s coupling coefficient of the cell is increased. If the second floating gate layer 50 is formed from texturized poly as described above, the capacitive area is increased even further.

In the FIG. 6 embodiment the first floating gate layer is oriented in a first direction (horizontally) and the second floating gate is oriented in a second direction (vertically) perpendicular with the first direction. As the height of the recess defined by the second floating gate layer increases, the capacitive coupling between the floating gate and the control gate also increases.

Thus a floating gate device such as a flash EPROM device formed according to the instant invention has improved coupling between the floating gate and the control gate. This improves the coupling coefficient, and allows the cell size to be decreased while maintaining a desired coupling coefficient. It is estimated that by using the texturized second floating gate layer described above, the capacitive coupling between the floating gate and the control gate will be between about 0.60 and about 0.95.

While this invention has been described with reference to illustrative embodiments, this description is not meant to be construed in a limiting sense. Various modifications of the illustrative embodiments, as well as additional embodiments of the invention, will be apparent to persons skilled in the art upon reference to this description. It is therefore contemplated that the appended claims will cover any such modifications or embodiments as fall within the true scope of the invention.

What is claimed is:

1. A floating gate memory device comprising:
   a first conductive floating gate layer oriented in a first direction;
   a second conductive floating gate layer predominantly oriented in a second direction generally perpendicular with said first direction, wherein said second conductive floating gate layer contacts said first conductive floating gate layer; and
   a dielectric layer comprising at least one sidewall and an upper surface which intersects said at least one sidewall, wherein said dielectric layer overlies a portion of said first floating gate layer and said second floating gate layer contacts said sidewall and said upper surface.

2. The floating gate memory device of claim 1 wherein said second floating gate layer comprises a recess therein and said device further comprises a control gate overlying said second floating gate layer and at least partially received by said recess.

3. The floating gate memory device of claim 2 wherein said control gate is conformal and substantially coextensive with said second floating gate layer.

4. The floating gate memory device of claim 1 wherein said second floating gate layer comprises a textured polysilicon portion.

5. The floating gate memory device of claim 1 further comprising a tunnel oxide layer contacting said first floating gate layer, wherein said first floating gate layer is interposed between said tunnel oxide and said second floating gate layer.

* * * * *